(12) United States Patent
Varricchione

(10) Patent No.: US 7,728,638 B2
(45) Date of Patent: Jun. 1, 2010

(54) ELECTRONIC SYSTEM THAT ADJUSTS DLL LOCK STATE ACQUISITION TIME

(75) Inventor: Jason Varricchione, Williston, VT (US)

(73) Assignee: Qimonda North America Corp., Cary, NC (US)

( * ) Notice: Subject to any disclaimer, the term of this patent is extended or adjusted under 35 U.S.C. 154(b) by 0 days.

(21) Appl. No.: 12/109,609

(22) Filed: Apr. 25, 2008

(65) Prior Publication Data

US 2009/0267663 A1 Oct. 29, 2009

(51) Int. Cl.
H03L 7/06 (2006.01)
(52) U.S. Cl. .......... 327/158; 327/149
(58) Field of Classification Search ........... 327/149, 327/158
See application file for complete search history.

(56) References Cited

U.S. PATENT DOCUMENTS

| | | | |
|---|---|---|---|
| 5,337,285 A | 8/1994 | Ware et al. | |
| 6,266,294 B1 | 7/2001 | Yada et al. | |
| 6,388,482 B1 * | 5/2002 | Schnell et al. | 327/158 |
| 6,480,439 B2 * | 11/2002 | Tokutome et al. | 365/189.15 |
| 6,525,988 B2 | 2/2003 | Ryu et al. | |
| 6,678,206 B2 | 1/2004 | Chu et al. | |
| 6,836,503 B2 * | 12/2004 | Best et al. | 375/355 |
| 7,388,415 B2 * | 6/2008 | Lee | 327/158 |
| 7,414,447 B2 * | 8/2008 | Cho | 327/158 |
| 7,477,715 B2 * | 1/2009 | Byun et al. | 375/373 |
| 7,486,119 B2 * | 2/2009 | Lee | 327/158 |
| 7,496,781 B2 * | 2/2009 | Tamura et al. | 713/600 |
| 2002/0039323 A1 * | 4/2002 | Tokutome et al. | 365/233 |
| 2006/0250877 A1 * | 11/2006 | Smith et al. | 365/229 |
| 2007/0176657 A1 * | 8/2007 | Byun et al. | 327/158 |
| 2007/0188206 A1 * | 8/2007 | Lee | 327/158 |
| 2007/0279111 A1 * | 12/2007 | Maeda et al. | 327/158 |
| 2008/0079469 A1 * | 4/2008 | Cho | 327/158 |
| 2008/0272812 A1 * | 11/2008 | Cho | 327/158 |

* cited by examiner

Primary Examiner—Lincoln Donovan
Assistant Examiner—Adam D Houston
(74) Attorney, Agent, or Firm—Dicke, Billig & Czaja, PLLC

(57) ABSTRACT

One embodiment provides an electronic system including a delay locked loop and a control circuit. The delay locked loop is configured to be enabled and update lock state data and to be disabled and store the locked state data. The control circuit is configured to periodically enable the delay locked loop in standby mode at an update interval and for an enable period. The control circuit controls the length of the update interval and the length of the enable period to adjust lock state acquisition time for the delay locked loop in exiting the standby mode.

21 Claims, 5 Drawing Sheets

ELECTRONIC SYSTEM THAT ADJUSTS DLL LOCK STATE ACQUISITION TIME

BACKGROUND

Typically, an electronic system includes a number of integrated circuit chips that communicate with one another to perform system applications. Often, the electronic system includes a controller, such as a micro-processor, and one or more memory chips, such as random access memory (RAM) chips. The controller communicates with the memory to store data and to read the stored data.

The RAM chips can be any suitable type of RAM, such as dynamic RAM (DRAM) including single data rate synchronous DRAM (SDR-SDRAM), double data rate SDRAM (DDR-SDRAM), graphics DDR-SDRAM (GDDR-SDRAM), low power SDR-SDRAM (LPSDR-SDRAM), and low power DDR-SDRAM (LPDDR-SDRAM). Also, the RAM chips can be any suitable generation of RAM, including double data rate two SDRAM (DDR2-SDRAM) and higher generations of RAM. Usually, each new generation of RAM operates at an increased clock speed and/or an increased data rate from the previous generation.

Sometimes, data and strobe signals are communicated between chips, such as a controller and RAM, to read and write data. To write data from the controller to the RAM, data and a clock or strobe signal are transmitted to the RAM and the received data is clocked into the RAM via the clock signal. To read data from the RAM, output data and a strobe signal are transmitted from the RAM. The output data and strobe signal are aligned to a clock signal via a delay locked loop (DLL).

Typically, the RAM receives an external clock signal and the DLL receives the external clock signal or an on-chip clock signal based on the external clock signal. The DLL provides an internal clock signal based on the external clock signal. The internal clock signal clocks the output data and strobe signal out of the RAM via output circuitry. The internal clock signal is fed back to a phase detector via a delay that mimics the delay of the output circuitry. The DLL aligns and locks the delayed internal clock signal to the external clock signal, which aligns the output data and strobe signal to the external clock signal. Since the external clock signal may drift over time and changes in the supply voltage and temperature may cause timing changes, the DLL runs continuously to maintain a lock state, which consumes considerable current.

In standby mode, integrated circuit chips are put into a low power state. If a DLL runs continuously in standby mode, the DLL is ready to drive output data as soon as the chip comes out of standby mode, however, considerable power is consumed in standby mode. If the DLL is switched off or loses lock state in standby mode, it takes considerable time to exit standby mode because the DLL must re-acquire lock state. As speeds increase and power consumption becomes more critical, these problems are amplified.

For these and other reasons there is a need for the present invention.

SUMMARY

The present disclosure describes an electronic system including a delay locked loop and a control circuit that adjusts lock state acquisition time as the delay locked loop exits standby mode. One embodiment provides an electronic system including a delay locked loop and a control circuit. The delay locked loop is configured to be enabled and update lock state data and to be disabled and store the locked state data. The control circuit is configured to periodically enable the delay locked loop in standby mode at an update interval and for an enable period. The control circuit controls the length of the update interval and the length of the enable period to adjust lock state acquisition time for the delay locked loop in exiting the standby mode.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
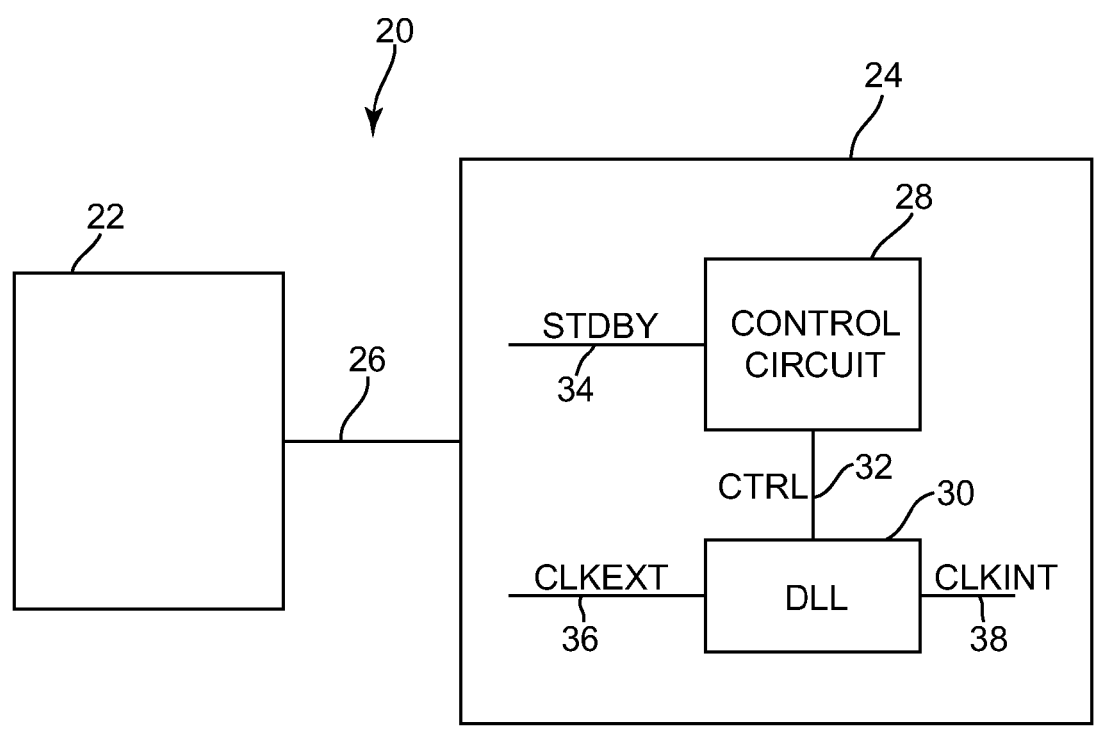
FIG. 1 is a block diagram illustrating one embodiment of an electronic system according to the present invention.

FIG. 1 is a block diagram illustrating one embodiment of an electronic system 20 according to the present invention. The electronic system 20 includes a first integrated circuit chip 22 and a second integrated circuit chip 24. Chip 22 is electrically coupled to chip 24 via communications path 26. In one embodiment, chip 22 is a memory controller and chip 24 is a RAM, where the controller and the RAM communicate with one another via communications path 26 to perform system applications. In one embodiment, chip 24 can be any suitable type of RAM, such as a DRAM, an SDR-SDRAM, a DDR-SDRAM, a GDDR-SDRAM, a LPSDR-SDRAM, or a LPDDR-SDRAM and chip 24 can be any suitable generation of RAM. In other embodiments, chip 22 and chip 24 can be any suitable chips.

Chip 24 includes a control circuit 28 and a DLL 30. Control circuit 28 is electrically coupled to DLL 30 via control signal path 32. Control circuit 28 receives standby signal STDBY at 34 and provides a control signal CTRL at 32 to DLL 30 via control signal path 32. In one embodiment, control circuit 28 enables or disables DLL 30 via control signal CTRL at 32. In one embodiment, control circuit 28 switches delay lines in DLL 30 via control signal CTRL at 32.

DLL 30 receives control signal CTRL at 32 and an external clock signal CLKEXT at 36 and provides an internal clock signal CLKINT at 38. External clock signal CLKEXT at 36 can be any suitable clock signal, such as a system clock signal, an on-chip generated clock signal, a controller clock signal, an on-chip clock signal based on a controller clock signal, an external clock signal received by chip 24, and an on-chip clock signal based on an external clock signal received by chip 24.

If enabled, DLL 30 updates lock state data as it tries to obtain a lock state and lock onto external clock signal CLKEXT at 36. In the lock state, internal clock signal CLKINT at 38 and external clock signal CLKEXT at 36 are synchronized or have a fixed timing relationship between them. If DLL 30 is disabled, DLL 30 stores the updated lock state data. Internal clock signal CLKINT at 38 can be used in chip 24 to provide clocking for functions, such as inputting data, processing data, outputting a strobe signal, and outputting output data.

In one embodiment, edges of the output data are aligned with edges of external clock signal CLKEXT at 36. In one embodiment, edges of the strobe signal are aligned with edges of external clock signal CLKEXT at 36. In one embodiment, edges of the strobe signal are aligned with edges of the output data. In one embodiment, edges of the strobe signal are aligned with edges of the output data and edges of external clock signal CLKEXT at 36.

In one embodiment, control circuit 28 disables DLL 30 in response to an active standby signal STDBY. DLL 30 stores the updated lock state data. In standby mode, control circuit 28 periodically enables DLL 30 at an update interval and for an enable period. While enabled, DLL 30 updates lock state data. DLL 30 does not run continuously in standby mode, which reduces standby mode current and power consumption. Control circuit 28 controls the length of the update interval and the length of the enable period to adjust power consumption during the standby mode.

In one embodiment, control circuit 28 disables DLL 30 in response to an active standby signal STDBY and DLL 30 stores the updated lock state data. In standby mode, control circuit 28 periodically enables DLL 30 at an update interval and for an enable period and DLL 30 runs during the enable period to obtain either a lock state or something less than the lock state, referred to as a partial lock state. If DLL 30 obtains the lock state during each enable period, then the time it takes to obtain lock state and exit standby mode is reduced. If DLL 30 obtains a partial lock state, then the time it takes to obtain lock state and exit standby mode is increased. Control circuit 28 controls the length of the update interval and the length of the enable period to adjust lock state acquisition time of DLL 30 while exiting standby mode.

In one embodiment, control circuit 28 periodically enables DLL 30 in standby mode at an update interval and for an enable period, where the enable period is not long enough to ensure that DLL 30 obtains the lock state. This is referred to as obtaining a partial lock state. Control circuit 28 enables DLL 30 for the enable period to obtain partial lock state data corresponding to a partial lock state of DLL 30 and DLL 30 updates the lock state data to the partial lock state data.

In one embodiment, control circuit 28 includes a programmable register that is programmed via an external device, such as chip 22, to set the length of the enable period. In one embodiment, control circuit 28 includes a programmable memory that is programmed via an external device, such as chip 22, to set the length of the enable period. In one embodiment, the length of the enable period is set via a mask step. In other embodiments, control circuit 28 sets the length of the enable period via any suitable hardware and/or software.

In one embodiment, control circuit 28 includes a programmable register that is programmed via an external device, such as chip 22, to set the length of the update interval. In one embodiment, control circuit 28 includes a programmable memory that is programmed via an external device, such as chip 22, to set the length of the update interval. In one embodiment, the length of the update interval is set via a mask step. In other embodiments, control circuit 28 sets the length of the update interval via any suitable hardware and/or software.

In one embodiment, DLL 30 includes a fine delay line and a coarse delay line and control circuit 28 controls which delay line is switched into DLL 30. Control circuit 28 switches the fine delay line into DLL 30 to obtain lock state data in the normal processing mode. Control circuit 28 switches the fine delay line out of DLL 30 and the coarse delay line into DLL 30 to obtain lock state data in the standby mode. Using only the coarse delay line in standby mode reduces delay line switching and standby mode power consumption.

In one embodiment, control circuit 28 switches the fine delay line out of DLL 30 and the coarse delay line into DLL 30 to obtain lock state data in standby mode and DLL 30 runs continuously in standby mode. In one embodiment, control circuit 28 switches the fine delay line out of DLL 30 and the coarse delay line into DLL 30 to obtain lock state data in standby mode and control circuit 28 periodically enables DLL 30 at an update interval and for an enable period in standby mode.

Where control circuit 28 periodically enables DLL 30 at an update interval and for an enable period, control circuit 28 controls the length of the update interval and the length of the enable period to adjust the trade off between power consumption during standby mode and lock state acquisition time while exiting standby mode. This is useful in systems and devices such as low power memory devices.

Figure 2:
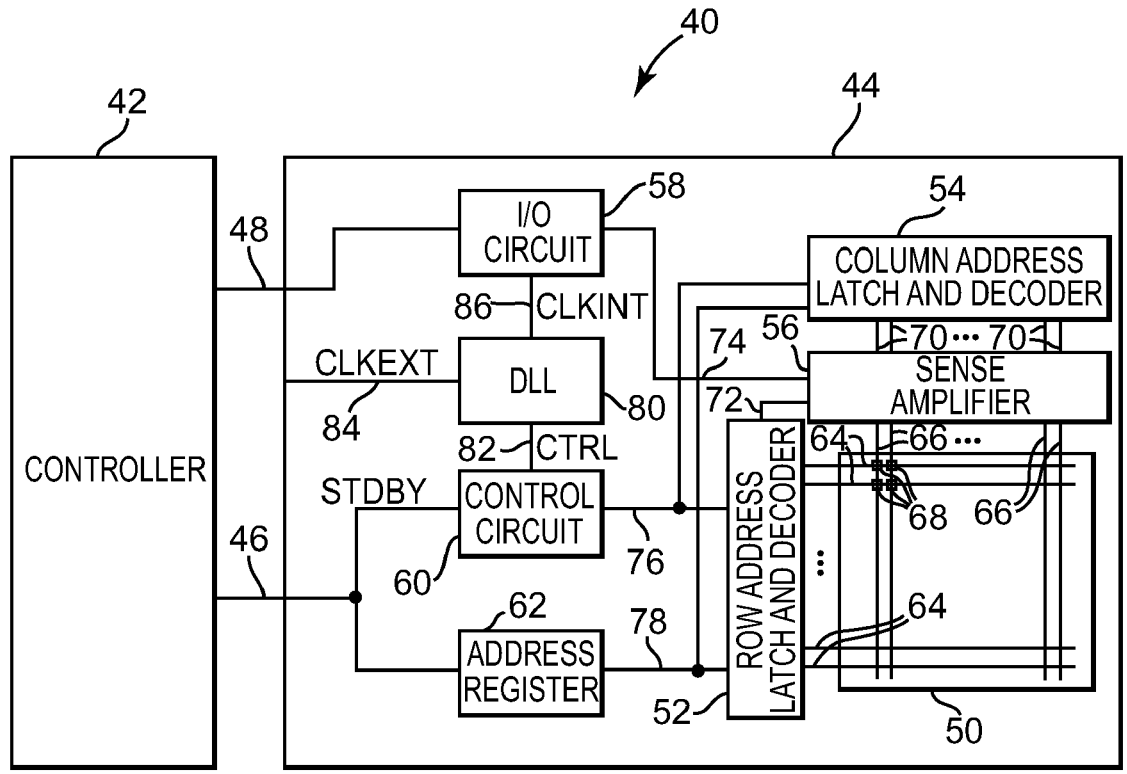
FIG. 2 is a block diagram illustrating one embodiment of an electronic system including a controller and a RAM.

FIG. 2 is a block diagram illustrating one embodiment of an electronic system 40 according to the present invention. Electronic system 40 includes a controller 42 and a RAM 44. Controller 42 is electrically coupled to RAM 44 via memory communications path 46 and data communications path 48. Controller 42 provides row and column addresses and control signals to RAM 44 via memory communications path 46. Controller 42 provides data signals and strobe signals to RAM 44 and receives data signals and strobe signals from RAM 44 via data communications path 48. RAM 44 can be any suitable type of RAM, such as a DRAM, an SDR-SDRAM, a DDR-SDRAM, a GDDR-SDRAM, a LPSDR-SDRAM, or a LPDDR-SDRAM.

RAM 44 includes an array of memory cells 50, a row address latch and decoder 52, a column address latch and decoder 54, a sense amplifier circuit 56, a RAM I/O circuit 58, a control circuit 60, an address register 62, and a DLL 80. Conductive word lines 64, referred to as row select lines, extend in the x-direction across the array of memory cells 50. Conductive bit lines 66, referred to as digit lines, extend in the y-direction across the array of memory cells 50. A memory cell 68 is located at each cross point of a word line 64 and a bit line 66.

Each word line 64 is electrically coupled to row address latch and decoder 52 and each bit line 66 is electrically coupled to one of the sense amplifiers in sense amplifier circuit 56. The sense amplifier circuit 56 is electrically coupled to column address latch and decoder 54 via conductive column select lines 70. Also, sense amplifier circuit 56 is electrically coupled to row address latch and decoder 52 via communications path 72 and to RAM I/O circuit 58 via I/O communications path 74. RAM I/O circuit 58 is electrically coupled to controller 42 via data communications path 48. Data signals and strobe signals are transferred between RAM I/O circuit 58 and controller 42 via data communications path 48.

Controller 42 is electrically coupled to RAM I/O circuit 58 via data communications path 48 and to control circuit 60 and address register 62 via memory communications path 46. Address register 62 is electrically coupled to row address latch and decoder 52 and column address latch and decoder 54 via row and column address lines 78. Control circuit 60 is electrically coupled to row address latch and decoder 52 and column address latch and decoder 54 via control communications path 76. Control circuit 60 is also electrically coupled to DLL 80 via control signal path 82. DLL 80 receives external clock signal CLKEXT at 84 and DLL 80 is electrically coupled to RAM I/O circuit 58 via internal clock signal path 86.

Address register 62 receives row and column addresses from controller 42 via memory communications path 46. Address register 62 supplies a row address to row address latch and decoder 52 via row and column address lines 78, and control circuit 60 supplies a RAS signal to row address latch and decoder 52 via control communications path 76 to latch the supplied row address into row address latch and decoder 52. Address register 62 supplies a column address to column address latch and decoder 54 via row and column address lines 78, and control circuit 60 supplies a CAS signal to column address latch and decoder 54 via control communications path 76 to latch the supplied column address into column address latch and decoder 54.

Row address latch and decoder 52 receives row addresses and RAS signals and latches the row addresses into row address latch and decoder 52. Row address latch and decoder 52 decodes each of the row addresses to select a row of memory cells 68. In addition, row address latch and decoder 52 provides sense amplifier activation signals and equalization and precharge signals to sense amplifier circuit 56 via communications path 72.

Column address latch and decoder 54 activates column select lines 70 to connect sense amplifiers in sense amplifier circuit 56 to RAM I/O circuit 58. Column address latch and decoder 54 receives a column address and latches the column address into column address latch and decoder 54. Column address latch and decoder 54 decodes the column address to select addressed column select lines 70. In addition, column address latch and decoder 54 receives column select line activation signals from control circuit 60 via control communications path 76. The column select line activation signals indicate which of the addressed column select lines 70 are to be activated by column address latch and decoder 54. Column address latch and decoder 54 activates column select lines 70 that are addressed by the column address and selected for activation by the column select line activation signals. Activated column select lines 70 are provided to sense amplifier circuit 56 to connect sense amplifiers in sense amplifier circuit 56 to RAM I/O circuit 58.

Control circuit 60 receives addresses and control signals from controller 42 via memory communications path 46. Controller 42 provides control signals, such as read/write enable, RAS and CAS signals, and standby signal STDBY to control circuit 60. Control circuit 60 provides RAS signals to row address latch and decoder 52 and CAS signals to column address latch and decoder 54. Also, control circuit 60 provides control signals to column address latch and decoder 54 to selectively activate column select lines 70. In addition, control circuit 60 receives standby signal STDBY at 46 and provides control signal CTRL at 82 to DLL 80 via control signal path 82. Control circuit 60 periodically enables DLL 80 at an update interval and for an enable period. In one embodiment, control circuit 60 enables and disables DLL 80 via control signal CTRL at 82. In one embodiment, control circuit 60 switches delay lines in and out of DLL 80 via control signal CTRL at 82.

In one embodiment, control circuit 60 includes a programmable register that is programmed via an external device to set the length of the enable period. In one embodiment, control circuit 60 includes a programmable memory that is programmed via an external device to set the length of the enable period. In one embodiment, the length of the enable period is set via a mask step. In other embodiments, control circuit 60 sets the length of the enable period via any suitable hardware and/or software.

In one embodiment, control circuit 60 includes a programmable register that is programmed via an external device to set the length of the update interval. In one embodiment, control circuit 60 includes a programmable memory that is programmed via an external device to set the length of the update interval. In one embodiment, the length of the update interval is set via a mask step. In other embodiments, control circuit 60 sets the length of the update interval via any suitable hardware and/or software.

DLL 80 receives control signal CTRL at 82 and external clock signal CLKEXT at 84. The external clock signal CLKEXT at 84 can be any suitable clock signal, such as a system clock signal, a clock signal provided by controller 42, a clock signal provided by an external clock circuit, a clock signal generated on RAM 44, an external clock signal received by RAM 44, or an on-chip clock signal based on an external clock signal received by RAM 44.

DLL 80 provides internal clock signal CLKINT at 86 to RAM I/O circuit 58 via internal clock signal path 86. If enabled, DLL 80 updates lock state data as it tries to obtain a lock state and lock onto external clock signal CLKEXT at 84. In the lock state, internal clock signal CLKINT at 86 and external clock signal CLKEXT at 84 are synchronized or have a fixed timing relationship between them. If DLL 80 is disabled, DLL 80 stores the updated lock state data. Internal clock signal CLKINT at 86 is used in RAM I/O circuit 58 to provide clocking for functions, such as inputting data, processing data, outputting a strobe signal, and outputting output data.

Controller 42 and RAM I/O circuit 58 communicate data signals and strobe signals between controller 42 and RAM 44 via data communications path 48. RAM I/O circuit 58 includes a suitable number of transmitter and receiver pairs and controller 42 includes a suitable number of transmitter and receiver pairs. Each transmitter and receiver pair in RAM I/O circuit 58 corresponds to a transmitter and receiver pair in controller 42. Data communications path 48 includes one or more signal pathways and each transmitter and receiver pair in I/O circuit 58 is electrically coupled to the corresponding transmitter and receiver pair in controller 42 via at least one of the signal pathways in data communications path 48.

Sense amplifier circuit 56 includes sense amplifiers, equalization and precharge circuits, and switches. The sense amplifiers are differential input sense amplifiers and each sense amplifier receives one bit line 66 at each of two differential inputs. One of the differential inputs receives a data bit from a selected memory cell 68 and the other one of the differential inputs is used as a reference. The equalization and precharge circuits equalize the voltage on the bit lines 66 connected to the same sense amplifier prior to a read or write operation.

To read a data bit, a sense amplifier amplifies the difference between the data bit value and the reference value and provides a sensed output value to RAM I/O circuit 58 via I/O communications path 74. RAM I/O circuit 58 receives the sensed output value and clocks the sensed output value to data communications path 48 via internal clock signal CLKINT at 86. RAM I/O circuit 58 also outputs a strobe signal to data communications path 48 via internal clock signal CLKINT at 86.

In normal operation mode, DLL 80 is locked onto external clock signal CLKEXT at 84, which results in internal clock signal CLKINT at 86, the strobe signal, and the output value being synchronized to or having a fixed timing relationship to external clock signal CLKEXT at 84. Controller 48 or any other suitable circuit receives the strobe signal and the output value via data communications path 48.

In one embodiment, edges of the output data are aligned with edges of external clock signal CLKEXT at 84. In one embodiment, edges of the strobe signal are aligned with edges of external clock signal CLKEXT at 84. In one embodiment, edges of the strobe signal are aligned with edges of the output data. In one embodiment, edges of the strobe signal are aligned with edges of the output data and edges of external clock signal CLKEXT at 84.

To write a data bit, controller 42 provides a data signal to RAM I/O circuit 58 via data communications path 48. RAM I/O circuit 58 receives the data signal and clocks the data signal into RAM I/O circuit 58 via internal clock signal CLKINT at 86. RAM I/O circuit 58 provides each data bit to a sense amplifier in sense amplifier circuit 56 via I/O communications path 74. RAM I/O circuit 58 overdrives the sense amplifier to drive the data bit value onto a bit line 66 that is connected to one of the memory cells 68. RAM I/O circuit 58 also overdrives the inverse of the data bit value onto the reference bit line 66. The sense amplifier writes the received data bit value into the selected memory cell 68.

During a read operation, control circuit 60 receives read control signals and address register 62 receives the row address of a selected memory cell or cells 68. The row address is supplied from address register 62 to row address latch and decoder 52 and latched into row address latch and decoder 52 by control circuit 60 and a RAS signal. Row address latch and decoder 52 decodes the row address and activates the selected word line 64. As the selected word line 64 is activated, the value stored in each memory cell 68 coupled to the selected word line 64 is passed to the respective bit line 66. The bit value stored at a memory cell 68 is detected by a sense amplifier that is electrically coupled to the respective bit line 66.

Next, control circuit 60 and address register 62 receive the column address of the selected memory cell or cells 68. The column address is supplied from address register 62 to column address latch and decoder 54 and latched into column address latch and decoder 54 by control circuit 60 and a CAS signal. The column address latch and decoder 54 decodes the column address to select column select lines 70. Control circuit 60 provides control signals to column address latch and decoder 54 to selectively activate column select lines 70 and connect selected sense amplifiers to RAM I/O circuit 58. RAM I/O circuit 58 receives the sensed output values and clocks the sensed output values to data communications path 48 via internal clock signal CLKINT at 86. RAM I/O circuit 58 also outputs a strobe signal to data communications path 48 via internal clock signal CLKINT at 86.

DLL 80 is locked onto external clock signal CLKEXT at 84, which results in internal clock signal CLKINT at 86, the strobe signal, and the output values being synchronized to or having a fixed timing relationship to external clock signal CLKEXT at 84. Controller 48 or any other suitable circuit receives the strobe signal and the output values via data communications path 48.

During a write operation, control circuit 60 receives write control signals and address register 62 receives the row address of a selected memory cell or cells 68. The row address is supplied from address register 62 to row address latch and decoder 52 and latched into row address latch and decoder 52 by control circuit 60 and a RAS signal. The row address latch and decoder 52 decodes the row address and activates the selected word line 64. As the selected word line 64 is activated, the value stored in each memory cell 68 coupled to the selected word line 64 is passed to the respective bit line 66 and the sense amplifier that is electrically coupled to the respective bit line 66.

Control circuit 60 and address register 62 receive the column address of the selected memory cell or cells 68. Address register 62 supplies the column address to column address latch and decoder 54 and the column address is latched into column address latch and decoder 54 by control circuit 60 and a CAS signal. Column address latch and decoder 54 receives column select line activation signals from control circuit 60 and activates selected column select lines 70 to connect sense amplifiers in sense amplifier circuit 56 to RAM I/O circuit 58.

Data to be stored in the array of memory cells 50 is supplied from controller 42 to RAM I/O circuit 58 via data communications path 48. RAM I/O circuit 58 receives the data and clocks the data into RAM I/O circuit 58 via internal clock signal CLKINT at 86. RAM I/O circuit 58 provides data bits to sense amplifiers in sense amplifier circuit 56 via I/O communications path 74. RAM I/O circuit 58 overdrives the sense amplifiers to write data to the selected memory cell or cells 68 via bit lines 66.

In standby mode operations, control circuit 60 receives an active standby mode signal STDBY at 46 and disables DLL 80 via control signal CTRL at 82 in response to the active standby mode signal STDBY at 46. The disabled DLL 80 stores updated lock state data. In standby mode, control circuit 60 periodically enables and disables DLL 80. Control circuit 60 enables DLL 80 to run for an enable period to update lock state data during the enable period. Control circuit 60 disables DLL 80 after the enable period to conserve power and store the updated lock state data. After an update interval, control circuit 60 enables DLL 80 again to update lock state data and then disables DLL 80 to conserve power and store the updated lock state data. This process repeats in standby mode, such that DLL 80 does not run continuously in standby mode, which reduces standby mode current and power consumption.

Control circuit 60 enables DLL 80 at an update interval and for an enable period such that DLL 80 runs during the enable period to obtain either a lock state or a partial lock state. As used herein, a partial lock state is obtained whenever the enable period is not long enough to ensure that DLL 80 obtains the lock state. If the update interval and the enable period are set so DLL 80 is ensured of obtaining a lock state, then the time it takes to obtain lock state and exit standby mode is reduced. If the update interval and enable period are set so DLL 80 obtains a partial lock state, then the time it takes to obtain lock state and exit standby mode is often increased.

Control circuit 60 periodically enables DLL 80 at an update interval and for an enable period. Control circuit 60 controls the length of the update interval and the length of the enable period to adjust the trade off between power consumption during standby mode and lock state acquisition time while exiting standby mode. This is useful in systems and devices such as low power memory devices.

In one embodiment, DLL 80 includes a fine delay line and a coarse delay line and control circuit 60 controls which delay line is switched into DLL 80. Control circuit 60 switches the fine delay line into DLL 80 to obtain lock state data in the normal processing mode. Control circuit 60 receives the active standby mode signal STDBY at 46 and switches the fine delay line out of DLL 80 and the coarse delay line into DLL 80 in response to the active standby mode signal STDBY at 46 to obtain lock state data in the standby mode. Using only the coarse delay line in standby mode reduces delay line switching and standby mode power consumption.

In one embodiment, control circuit 60 receives the active standby mode signal STDBY at 46 and control circuit 60 does not disable DLL 80 in response to the active standby mode signal STDBY at 46. Instead, control circuit 60 switches the fine delay line out of DLL 80 and the coarse delay line into DLL 80 to obtain lock state data in standby mode and DLL 80 runs continuously in standby mode.

Figure 3:
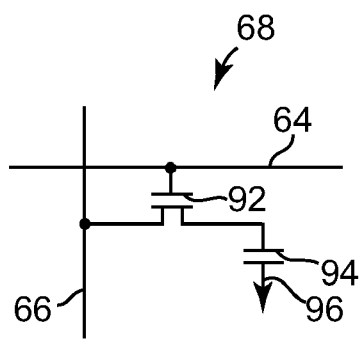
FIG. 3 is a diagram illustrating one embodiment of a memory cell in the array of memory cells.

FIG. 3 is a diagram illustrating one embodiment of a memory cell 68 in the array of memory cells 50. Memory cell 68 includes a transistor 92 and a capacitor 94. The gate of transistor 92 is electrically coupled to a word line 64. One side of the drain-source path of transistor 92 is electrically coupled to a bit line 66 and the other side of the drain-source path is electrically coupled to one side of capacitor 94. The other side of capacitor 94 is electrically coupled to a reference 96, such as one-half the supply voltage. Capacitor 94 is charged and discharged to represent a logic 0 or a logic 1.

During a read operation, word line 64 is activated to turn on transistor 92 and the value stored on capacitor 94 is read by a sense amplifier via bit line 66. During a write operation, word line 64 is activated to turn on transistor 92 to access capacitor 94. The sense amplifier connected to bit line 66 is overdriven to write a data value onto capacitor 94 via bit line 66 and transistor 92.

A read operation on memory cell 68 is a destructive read operation. After each read operation, capacitor 94 is recharged or discharged to the data value that was just read. In addition, even without a read operation, the charge on capacitor 94 discharges over time. To retain a stored value, memory cell 68 is refreshed periodically by reading and/or writing memory cell 68. All memory cells 68 in the array of memory cells 50 are periodically refreshed to maintain their values.

Figure 4:
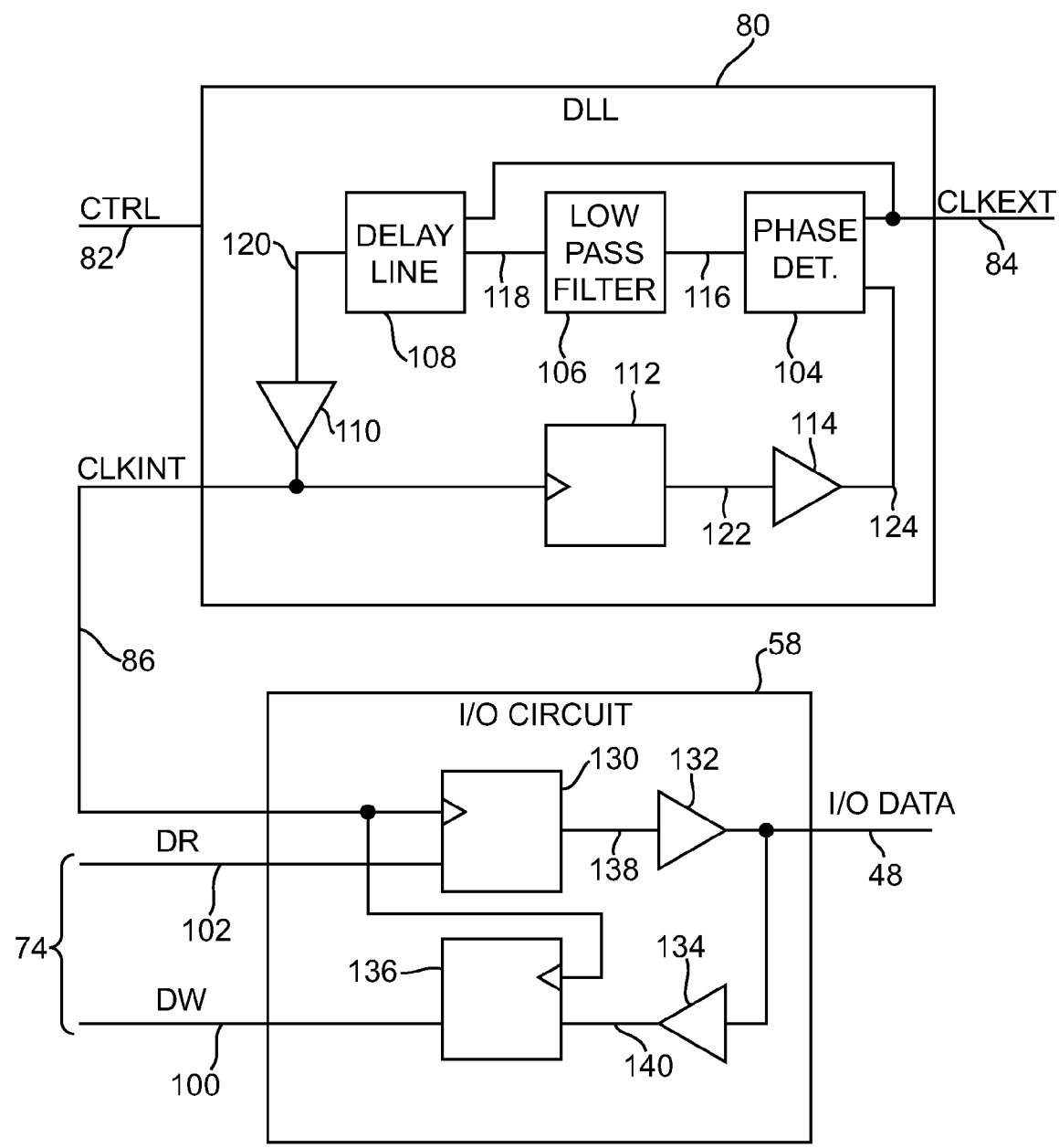
FIG. 4 is a block diagram illustrating one embodiment of a DLL and a RAM I/O circuit.

FIG. 4 is a block diagram illustrating one embodiment of DLL 80 and RAM I/O circuit 58. DLL 80 is electrically coupled to RAM I/O circuit 58 via internal clock signal path 86. DLL 80 and RAM I/O circuit 58 operate in RAM 44 (FIG. 2) as described above.

DLL 80 receives control signal CTRL at 82 and external clock signal CLKEXT at 84. DLL 80 provides internal clock signal CLKINT at 86 to RAM I/O circuit 58 via internal clock signal path 86. If enabled, DLL 80 updates lock state data as it tries to obtain a lock state and lock onto external clock signal CLKEXT at 84. In the lock state, internal clock signal CLKINT at 86 and external clock signal CLKEXT at 84 are synchronized or have a fixed timing relationship between them. If DLL 80 is disabled, DLL 80 stores the updated lock state data.

RAM I/O circuit 58 receives internal clock signal CLKINT at 86 and RAM I/O circuit 58 communicates data signals to and from controller 42 (FIG. 2) via data communications path 48. RAM I/O circuit 58 receives write data in I/O DATA at 48 via data communications path 48 and provides write data DW at 100 to sense amplifier circuit 56 via I/O communications path 74. RAM I/O circuit 58 receives read data DR at 102 from sense amplifier circuit 56 and provides read output data in I/O DATA at 48 via data communications path 48. Internal clock signal CLKINT at 86 is used in RAM I/O circuit 58 to provide clocking for functions, such as inputting data, processing data, and outputting read data DR at 102. In one embodiment, internal clock signal CLKINT at 86 is used in RAM I/O circuit 58 to output a strobe signal similar to outputting read data DR at 102. In one embodiment, internal clock signal CLKINT at 86 is used in RAM I/O circuit 58 to output a strobe signal and read data, where edges of the strobe signal align with edges of the read output data.

DLL 80 includes a phase detector 104, a low pass filter 106, a delay line circuit 108, a first buffer 110, a flip-flop 112, and a second buffer 114. Phase detector 104 receives external clock signal CLKEXT at 84 and is electrically coupled to low pass filter 106 via phase control signal path 116. Low pass filter 106 is electrically coupled to delay line circuit 108 via filter output path 118.

Delay line circuit 108 receives external clock signal CLKEXT at 84 and is electrically coupled to the input of first buffer 110 via delayed clock output path 120. The output of first buffer 110 provides internal clock signal CLKINT at 86 and is electrically coupled to the clock input of flip-flop 112 via internal clock signal path 86. The output of flip-flop 112 is electrically coupled to the input of second buffer 114 via flip-flop output path 122 and the output of second buffer 114 is electrically coupled to phase detector 104 via buffer output path 124.

Phase detector 104 detects the phase difference between external clock signal CLKEXT at 84 and the delayed internal clock signal at 124. The delayed internal clock signal at 124 is internal clock signal CLKINT at 86 delayed via flip-flop 112 and second buffer 114. Flip-flop 112 and second buffer 114 mimic the output delay associated with outputting read data from RAM I/O circuit 58. Phase detector 104 provides a phase control signal at 116 that indicates the detected phase difference between external clock signal CLKEXT at 84 and the delayed internal clock signal at 124.

Low pass filter 106 receives the phase control signal at 116 via phase control signal path 116 and provides a filtered phase control signal at 118. Low pass filter 106 filters the phase control signal at 116 to reduce high frequency components.

Delay line circuit 108 receives the filtered phase control signal at 118 via filter output path 118 and adjusts the delay through delay line circuit 108 of external clock signal CLKEXT at 84. Delay line circuit 108 provides a delayed external clock signal at 120.

First buffer 110 receives the delayed external clock signal at 120 via delayed clock output path 120 and provides internal clock signal CLKINT at 86. Flip-flop 112 is clocked via internal clock signal CLKINT at 86 and provides a flip-flop delayed clock signal at 122 to the input of second buffer 114 via flip-flop output path 122. Second buffer 114 receives the flip-flop delayed clock signal at 122 and provides the delayed internal clock signal at 124 to phase detector 104 via buffer output path 124. In the lock state, DLL 80 provides a substantially fixed timing relationship between external clock signal CLKEXT at 84 and the delayed internal clock signal at 124. Also, in the lock state, DLL 80 provides a substantially fixed timing relationship between external clock signal CLKEXT at 84 and internal clock signal CLKINT at 86.

RAM I/O circuit 58 includes a read flip-flop 130, a read output buffer 132, a write input buffer 134, and a write flip-flop 136.

The data input of read flip-flop 130 receives read data DR at 102 and the clock input of read flip-flop 130 receives internal clock signal CLKINT at 86 via internal clock signal path 86. The output of read flip-flop 130 is electrically coupled to the input of read output buffer 132 via data output path 138. Read flip-flop 130 clocks out read data DR at 102 via internal clock signal CLKINT at 86 and provides read data at 138. Read output buffer 132 receives the read data at 138 via data output path 138 and provides read output data in I/O DATA at 48. Since, flip-flop 112 and second buffer 114 mimic the output delay associated with flip-flop 130 and output buffer 132, edges of the read output data in I/O DATA at 48 are aligned with edges in the delayed internal clock signal at 124. In one embodiment, the delayed internal clock signal at 124 is output as a strobe signal in I/O DATA 48. Write input buffer 134 receives write data in I/O DATA at 48. The output of write input buffer 134 is electrically coupled to the data input of write flip-flop 136 via data input path 140. The clock input of write flip-flop 136 receives internal clock signal CLKINT at 86 via internal clock signal path 86. Write flip-flop 136 clocks in write data at 140 via internal clock signal CLKINT at 86 and provides write data DW at 100.

DLL 80 and RAM I/O circuit 58 provide a substantially fixed timing relationship between external clock signal CLKEXT at 84, internal clock signal CLKINT at 86, and data output in I/O DATA at 48. Internal clock signal CLKINT at 86 is delayed via flip-flop 112 and second buffer 114 to provide the delayed internal clock signal at 124, which is compared to external clock signal CLKEXT at 84. Also, internal clock signal CLKINT at 86 clocks read data DR at 102 into read flip-flop 130 and read data DR at 102 is delayed by read flip-flop 130 and read output buffer 132 before being output in I/O DATA at 48. The delay through flip-flop 112 and second buffer 114 is similar to the delay through read flip-flop 130 and read output buffer 132, which synchronizes read output data in I/O DATA at 48 and external clock signal CLKEXT at 84.

In one embodiment, DLL 80 is enabled via control signal CTRL at 82. If enabled, DLL 80 runs continuously to update lock state data as it tries to obtain a lock state in which it locks onto external clock signal CLKEXT at 84. In the lock state, delay line circuit 108 is controlled to delay external clock signal CLKEXT at 84 and provide the internal clock signal CLKINT at 86. The internal clock signal CLKINT at 86 is delayed and fed back to phase detector 104 to synchronize signals including the delayed internal clock signal at 124, internal clock signal CLKINT at 86, the strobe signal, output data in I/O DATA 48, and external clock signal CLKEXT at 36. In one embodiment, the lock state data is accumulated at phase detector 104. In one embodiment, the lock state data is accumulated at low pass filter 106. In one embodiment, the lock state data is accumulated at delay line circuit 108. In other embodiment, the lock state data is accumulated in any suitable circuit.

In one embodiment, DLL 80 is disabled via control signal CTRL at 82. If DLL 80 is disabled, DLL 80 stores the updated lock state data and circuits, such as phase detector 104, low pass filter 106, and delay line circuit 108, are disabled to conserve power. In one embodiment, the lock state data is stored at phase detector 104. In one embodiment, the lock state data is stored at low pass filter 106. In one embodiment, the lock state data is stored at delay line circuit 108.

In one embodiment, delay line circuit 108 includes a fine delay line and a coarse delay line, which are switched into DLL 80 via control signal CTRL at 82. In one embodiment, control circuit 60 (FIG. 2) switches the fine delay line into DLL 80 to obtain lock state data in the normal processing mode and control circuit 60 switches the fine delay line out of DLL 80 and the coarse delay line into DLL 80 to obtain lock state data in the standby mode.

Figure 5:
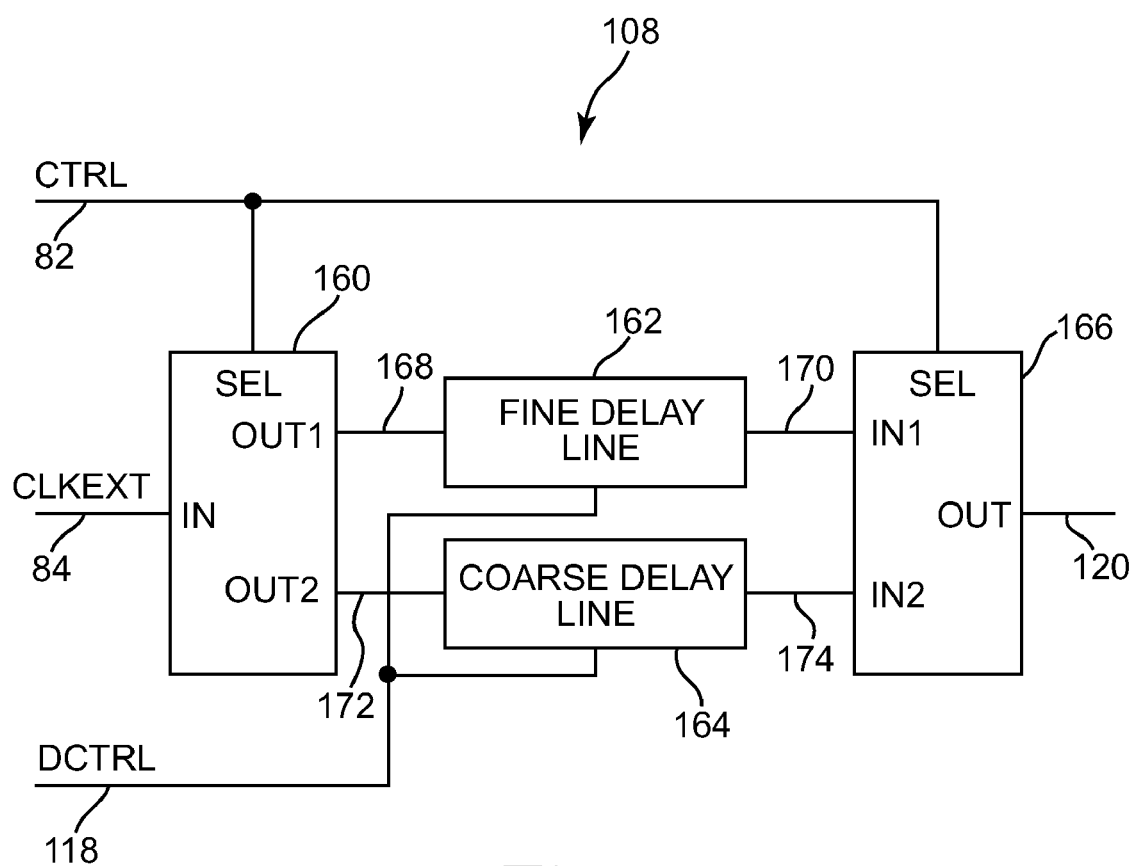
FIG. 5 is a diagram illustrating one embodiment of a delay line circuit.

FIG. 5 is a diagram illustrating one embodiment of delay line circuit 108. Delay line circuit 108 includes a clock input de-multiplexer 160, a fine delay line 162, a coarse delay line 164, and a clock output multiplexer 166. Input IN of clock input de-multiplexer 160 receives external clock signal CLKEXT at 84 and select input SEL of clock input de-multiplexer 160 receives control signal CTRL at 82. Clock input de-multiplexer 160 provides external clock signal CLKEXT at 84 to either output OUT1 or output OUT2 based on the state of control signal CTRL at 82. In one embodiment, if control signal CTRL at 82 is a zero, clock input de-multiplexer 160 provides external clock signal CLKEXT at 84 to output OUT1 and if control signal CTRL at 82 is a one, clock input de-multiplexer 160 provides external clock signal CLKEXT at 84 to output OUT2.

One input of fine delay line 162 is electrically coupled to output OUT1 of clock input de-multiplexer 160 via fine delay line input path 168 and the control input of fine delay line 162 receives delay control signal DCTRL at 118 via filter output path 118. Control signal DCTRL at 118 controls the length of the delay through fine delay line 162. The output of fine delay line 162 is electrically coupled to input IN1 of clock output multiplexer 166 via fine delay line output path 170.

One input of coarse delay line 164 is electrically coupled to output OUT2 of clock input de-multiplexer 160 via coarse delay line input path 172 and the control input of coarse delay line 164 receives delay control signal DCTRL at 118 via filter output path 118. Control signal DCTRL at 118 controls the length of the delay through coarse delay line 164. The output of coarse delay line 164 is electrically coupled to input IN2 of clock output multiplexer 166 via coarse delay line output path 174.

Clock output multiplexer 166 receives the delayed clock signal from fine delay line 162 at input IN1 and the delayed clock signal from coarse delay line 164 at input IN2. Select input SEL of clock output multiplexer 166 receives control signal CTRL at 82. Clock output multiplexer 166 provides either the delayed clock signal from fine delay line 162 or the delayed clock signal from coarse delay line 164 at output OUT based on the state of control signal CTRL at 82. In one embodiment, if control signal CTRL at 82 is a zero, clock output multiplexer 166 provides the delayed clock signal from fine delay line 162 at output OUT and if control signal CTRL at 82 is a one, clock output multiplexer 166 provides the delayed clock signal from coarse delay line 164 at output OUT.

In operation, clock input de-multiplexer 160 receives external clock signal CLKEXT at 84 and fine delay line 162 and coarse delay line 164 receive delay control signal DCTRL at 118. Clock input de-multiplexer 160 and clock output multiplexer 166 receive control signal CTRL at 82 to switch in a delay path through either fine delay line 162 or coarse delay line 164. Clock output multiplexer 166 provides the delayed clock signal from the switched in delay line at output OUT via delayed clock output path 120.

In one embodiment, control circuit 60 switches the fine delay line into DLL 80 to obtain lock state data in the normal processing mode and control circuit 60 switches the fine delay line out of DLL 80 and the coarse delay line into DLL 80 to obtain lock state data in the standby mode.

Figure 6:
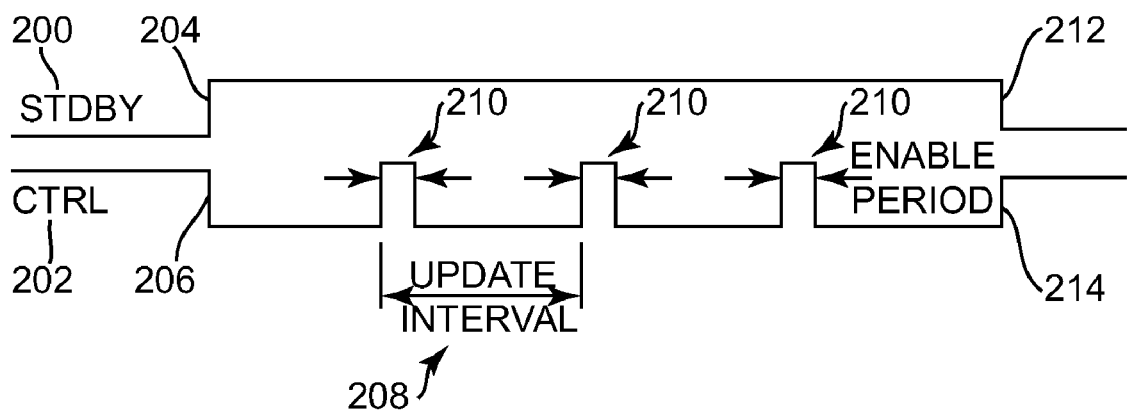
FIG. 6 is a timing diagram illustrating the operation of one embodiment of an electronic system, which enables and disables a DLL in standby mode.

FIG. 6 is a timing diagram illustrating the operation of one embodiment of electronic system 20 (FIG. 1). Control circuit 28 receives standby signal STDBY at 200 and provides control signal CTRL at 202 to DLL 30. At 204, standby signal STDBY at 200 transitions to an active high logic state and chip 24 enters standby mode. In response to the active high logic state, control circuit 28 provides a high to low transition at 206 in control signal CTRL at 202. DLL 30 stores the updated lock state data in response to the high to low transition at 206 and entering standby mode.

In standby mode, control circuit 28 periodically enables DLL 30 at update interval 208 and for enable period 210. DLL 30 does not run continuously in standby mode, which reduces standby mode current and power consumption. During each enable period 210, DLL 30 runs during the enable period to obtain either a lock state or a partial lock state. If DLL 30 obtains the lock state during each enable period, then the time it takes to obtain lock state and exit standby mode is reduced. If DLL 30 obtains a partial lock state, then the time it takes to obtain lock state and exit standby mode is increased. Control circuit 28 controls the length of the update interval and the length of the enable period to adjust power consumption during the standby mode and to adjust lock state acquisition time of DLL 30 while exiting standby mode.

At 212, standby signal STDBY at 200 transitions to an inactive low logic state and chip 24 exits standby mode. In response to the inactive low logic state, control circuit 28 provides a low to high transition at 214 in control signal CTRL at 202. DLL 30 is enabled to obtain a lock state, locking onto the external clock signal CLKEXT as DLL 30 exits standby mode and before entering normal operation mode.

Where control circuit 28 periodically enables DLL 30 at update interval 208 and for enable period 210, control circuit 28 controls the length of the update interval 208 and the length of the enable period 210 to adjust the trade off between power consumption during standby mode and lock state acquisition time while exiting standby mode. This is useful in systems and devices such as low power memory devices.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An electronic system comprising:
a delay locked loop configured to be enabled and update lock state data and to be disabled and store the lock state data; and
a control circuit configured to periodically enable the delay locked loop in standby mode at an update interval and for an enable period, wherein the control circuit is configured to control the length of the update interval and the length of the enable period to obtain partial lock state data corresponding to a partial lock state of the delay locked loop to adjust power consumption during the standby mode and to adjust lock state acquisition time for the delay locked loop in exiting the standby mode,
wherein the delay locked loop comprises:
a fine delay line that is switched into the delay locked loop in normal mode and switched out of the delay locked loop in the standby mode; and
a coarse delay line that is switched into the delay locked loop in the standby mode to obtain the partial lock state data in the standby mode.

2. The electronic system of claim 1, wherein the control circuit is configured to be programmable to set the length of the enable period.

3. The electronic system of claim 1, wherein the control circuit is configured to be programmable to set the length of the update interval.

4. The electronic system of claim 1, wherein the delay locked loop updates the lock state data to the partial lock state data.

5. An electronic system comprising:
a delay locked loop configured to be enabled and update lock state data and to be disabled and store the lock state data; and
a control circuit configured to periodically enable the delay locked loop in standby mode at an update interval and for an enable period, wherein the control circuit enables the delay locked loop for the enable period to obtain partial lock state data corresponding to a partial lock state of the delay locked loop and updates the lock state data to the partial lock state data,
wherein the delay locked loop comprises:
a fine delay line that is switched into the delay locked loop in normal mode and switched out of the delay locked loop in the standby mode; and
a coarse delay line that is switched into the delay locked loop to obtain the partial lock state data in the standby mode.

6. The electronic system of claim 5, wherein the control circuit is configured to be programmable to set the length of the enable period.

7. The electronic system of claim 5, wherein the control circuit is configured to be programmable to set the length of the update interval.

8. An integrated circuit comprising:
a delay locked loop including a fine delay line and a coarse delay line; and
a control circuit configured to switch the fine delay line into the delay locked loop in normal mode and to switch the fine delay line out of the delay locked loop in standby mode, and to switch the coarse delay line into the delay locked loop in the standby mode.

9. The integrated circuit of claim 8, wherein the delay locked loop is configured to be enabled and update lock state data and to be disabled and store the lock state data and the control circuit is configured to disable the delay locked loop in the standby mode and periodically enable the delay locked loop in the standby mode.

10. The integrated circuit of claim 8, comprising:
a random access memory array.

11. An integrated circuit comprising:
means for aligning a first clock signal and a second clock signal via lock state data;
means for updating the lock state data;
means for storing the lock state data;
means for periodically updating the lock state data in standby mode at an update interval and for an enable period; and
means for controlling the length of the update interval and the length of the enable period to obtain partial lock state data corresponding to a partial lock state of the delay locked loop to adjust power consumption during the standby mode and to adjust lock state acquisition time in exiting the standby mode, wherein the means for aligning comprises:
    means for providing a fine delay in the delay locked loop in normal mode;
    means for switching the fine delay out of the delay locked loop in the standby mode; and
    means for providing a coarse delay in the delay locked loop in the standby mode.

12. The integrated circuit of claim 11, wherein the means for controlling comprises:
    means for programming the length of the enable period.

13. The integrated circuit of claim 11, wherein the means for controlling comprises:
    means for programming the length of the update interval.

14. A method of operating a delay locked loop, comprising:
    aligning a first clock signal and a second clock signal via lock state data;
    storing the lock state data;
    periodically updating the lock state data in standby mode during an enable period and at an update interval;
    adjusting the length of the update interval and the length of the enable period to obtain partial lock state data corresponding to a partial lock state of the delay locked loop to adjust power consumption during the standby mode and to adjust lock state acquisition time in exiting the standby mode;
    switching a fine delay line into the delay locked loop in normal mode;
    switching the fine delay line out of the delay locked loop in the standby mode; and
    switching a coarse delay line into the delay locked loop in the standby mode.

15. The method of claim 14, wherein adjusting the length of the update interval and the length of the enable period comprises:
    programming the length of the enable period; and
    programming the length of the update interval.

16. The method of claim 14, wherein periodically updating the lock state data comprises:
    updating the lock state data to the partial lock state data.

17. A method of operating a delay locked loop, comprising:
    enabling the delay locked loop to update lock state data;
    disabling the delay locked loop in entering standby mode;
    storing the lock state data in entering the standby mode;
    periodically enabling the delay locked loon in the standby mode at an update interval and for an enable period to obtain partial lock state data corresponding to a partial lock state of the delay locked loop;
    updating the lock state data to the partial lock state data;
    switching a fine delay line into the delay locked loop in normal mode;
    switching the fine delay line out of the delay locked loop in the standby mode; and
    switching a coarse delay line into the delay locked loop in the standby mode.

18. The method of claim 17 comprising:
    programming the length of the enable period.

19. The method of claim 17, comprising:
    programming the length of the update interval.

20. A method of operating a delay locked loop, comprising:
    switching a fine delay line into the delay locked loop in normal mode;
    switching the fine delay line out of the delay locked loop in standby mode; and
    switching a coarse delay line into the delay locked loop in the standby mode.

21. The method of claim 20, comprising:
    enabling the delay locked loop to update lock state data;
    disabling the delay locked loop in entering standby mode;
    storing the lock state data in entering the standby mode;
    periodically enabling the delay locked loop in the standby mode.

* * * * *